(12) United States Patent
Melanson

(10) Patent No.: US 7,358,881 B2
(45) Date of Patent: Apr. 15, 2008

(54) QUANTIZER OVERLOAD PREVENTION FOR FEED-BACK TYPE DELTA-SIGMA MODULATORS

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/187,415

(22) Filed: Jul. 22, 2005

(65) Prior Publication Data

US 2007/0018866 A1    Jan. 25, 2007

(51) Int. Cl.
H03M 1/66    (2006.01)

(52) U.S. Cl. ...................... 341/144; 341/143
(58) Field of Classification Search ............... 341/143, 341/155, 172, 118, 120, 144
See application file for complete search history.

(56) References Cited

U.S. PATENT DOCUMENTS

| | | | | |
|---|---|---|---|---|
| 4,616,349 A * | 10/1986 | Shirley | ............ | 367/66 |
| 5,012,244 A | 4/1991 | Wellard et al. | ............ | 341/143 |
| 5,243,345 A * | 9/1993 | Naus et al. | ............ | 341/143 |
| 5,585,801 A | 12/1996 | Thurston | | |
| 5,654,711 A * | 8/1997 | Fujimori | ............ | 341/143 |
| 5,742,246 A * | 4/1998 | Kuo et al. | ............ | 341/143 |
| 5,757,301 A | 5/1998 | Kuo et al. | ............ | 341/143 |
| 5,793,316 A * | 8/1998 | Noguchi et al. | ............ | 341/77 |
| 5,793,811 A * | 8/1998 | Yu | ............ | 375/247 |
| 5,805,093 A * | 9/1998 | Heikkila et al. | ............ | 341/143 |
| 5,877,716 A * | 3/1999 | Tagami | ............ | 341/143 |
| 6,061,009 A | 5/2000 | Krone et al. | ............ | 341/143 |
| 6,064,326 A | 5/2000 | Krone et al. | ............ | 341/143 |
| 6,157,331 A | 12/2000 | Liu et al. | ............ | 341/143 |
| 6,362,763 B1 | 3/2002 | Wang | ............ | 341/143 |

(Continued)

OTHER PUBLICATIONS

F. Goodenough, "ISSCC Analog Technology," Electronic Design, Penton Media, Cleveland, OH, vol. 39, No. 3, Feb. 14, 1991.

(Continued)

*Primary Examiner*—Rexford Barnie
*Assistant Examiner*—Joseph Lauture
(74) *Attorney, Agent, or Firm*—Hamilton & Terrile, LLP; Kent B. Chambers

(57) ABSTRACT

A digital signal processing system includes a delta sigma modulator that maintains a low pass output during quantizer overload prevention conditions. In at least one embodiment, the delta sigma modulator includes a quantizer overload protected delta sigma modulator with an N-order feedback-type loop filter. A quantizer of the delta sigma modulator provides feedback to at least the first two filter stages of the loop filter. The loop filter includes at least N successive filter stages and limits an output of an initial filter stage during quantizer overload prevention conditions. If limiting the output of the initial filter stage is insufficient to prevent quantizer overload, the delta sigma modulator can progressively limit an output of at least the next successive filter stage to prevent quantizer overload, where N is a positive integer greater than or equal to two (2).

32 Claims, 5 Drawing Sheets

U.S. PATENT DOCUMENTS

| | | |
|---|---|---|
| 6,489,907 B2 | 12/2002 | Cusinato et al. ............ 341/143 |
| 6,515,604 B2 * | 2/2003 | Delano ....................... 341/143 |
| 6,724,332 B1 * | 4/2004 | Melanson ................... 341/143 |
| 6,768,436 B1 | 7/2004 | Chuang ...................... 341/143 |
| 6,822,594 B1 * | 11/2004 | Melanson et al. .......... 341/143 |
| 6,839,011 B1 * | 1/2005 | Hong .......................... 341/143 |
| 6,975,259 B1 * | 12/2005 | Jensen ........................ 341/143 |
| 6,990,152 B2 * | 1/2006 | Tagami ....................... 375/247 |
| 7,053,807 B1 | 5/2006 | Gaalaas ...................... 341/143 |
| 2005/0007267 A1 | 1/2005 | Zogakis et al. ............. 341/143 |

OTHER PUBLICATIONS

International Search Report and Written Opinion for PCT/US2006/027270 dated Nov. 23, 2006.

R. W. Adams, "Companded Predictive Delta Modulation: A Low-Cost Conversion Technique for Digital Recording," J. Audio Eng. Soc., vol. 32, No. 9, Sep. 1984.

C. Dunn et al., "Use of Clipping in Sigma-Delta Modulators," The Institute of Electrical Engineers IEE Coll. on Oversampling Techniques and Sigma-Delta Modulation, Mar. 30, 1994.

* cited by examiner

QUANTIZER OVERLOAD PREVENTION FOR FEED-BACK TYPE DELTA-SIGMA MODULATORS

BACKGROUND OF THE INVENTION

1. Field of the Invention

The present invention relates in general to the field of signal processing, and more specifically to a system and method for providing overload prevention for delta-sigma modulators using a multi-order, feedback loop filter topology.

2. Desription of the Related Art

Delta sigma modulators produce a high resolution output signal using a low-resolution quantizer. Delta sigma modulators achieve the high resolution by using oversampling data rates higher than the Nyquist rate. Many signal processing systems include delta sigma modulators to quantize an input signal into one or more bits at a high rate to produce a high resolution output signal. "Delta-sigma modulators" are also commonly referred to using other interchangeable terms such as "sigma-delta modulators", "delta-sigma converters", "sigma delta converters", and "noise shapers".

FIG. 1 depicts a basic N-order delta sigma modulator 100. The delta sigma modulator 100 includes a difference stage 101 to determine a difference signal $u_d(n)$ between an input signal x(n) and a quantizer feedback signal y(n−1). The digital input signal x(n) represents an oversampled version of an input signal from a signal source 103, such as a microphone or audio/visual playback device. The input signal can be any type of input signal, such as an audio input signal. A preprocessor generally includes a digital interpolator to generate the oversampled digital input signal. The quantizer feedback signal y(n−1) represents a one (1) cycle delay of the quantizer output signal y(n). Delta sigma modulator 100 includes a loop filter 102 to filter the difference signal $u_d(n)$. The loop filter 102 is implemented using a feed-forward type loop filter topology of order N, wherein N is a positive integer. The loop filter 102 includes N series connected filter stages 104.0, 104.1, . . . , 104.N−1. Each of the filter stages 104.0, 104.1, . . . , 104.N−1 includes an integrator, whose z domain representation is depicted in the exploded schematic 106. The output signals of all filter stages 104.0, 104.1, . . . , 104.N−1 are adjusted by respective coefficients $c_0, c_1, \ldots, c_{N-1}$ (also referred to as "weight factors") and added together by an adder stage 110 to generate a filter output/quantizer input signal $u_f(n)$. Each integrator of the filter stages 104.0, 104.1, . . . , 104.N−1 also generally includes a gain coefficient (not shown) that is determined using well-known digital design techniques to achieve the desired frequency response of the loop filter 102. For low frequency baseband signals, such as audio signals (approx. 0 Hz to 25 kHz), the loop filter 102 functions as a low pass filter during non-quantizer overload conditions with a relatively high gain for frequencies in the baseband.

The quantizer 108 provides a single-bit or multi-bit output signal y(n). The quantizer introduces a quantization error. Filtering of the quantization error by the delta sigma modulator 100 minimizes the quantization error at low, baseband frequencies. Thus, the delta sigma modulator 100 exhibits "noise shaping" behavior by reducing noise in the baseband. Subsequent signal processing of output signal y(n) can filter out signal frequencies, including noise, located above the baseband.

The attainable signal-to-noise ratio (SNR) of the delta sigma modulator 100 in the baseband depends in part on the amount of oversampling of the original input signal and the order of the loop filter 102. Higher order filters require less oversampling to maintain acceptable SNR. However, the order is limited by instabilities in the loop filter 102. Instabilities in the loop filter 102 can be caused by, for example, large sample-to-sample excursions of the input signal x(n). The order of loop filter 102 is also limited by overload of the quantizer 108. Quantizer overload occurs when the quantizer input signal $u_f(n)$ exceeds an input signal peak operating range of the quantizer 108. In multi-order delta sigma modulators, estimating a maximum range of input signal x(n) that will with certainty prevent the quantizer input signal $u_d(n)$ from a obtaining a value outside the operation range of quantizer 108 is difficult to determine exactly. Estimations of a maximum range for input signal x(n) remains difficult because of the complexity of causal relationships, the influence of noise generated by the delta sigma modulator from non-ideal physical components, rounding errors, and/or other factors.

Consequently, one solution to prevent quantizer overload conservatively limits the amplitude range of the input signal x(n) to values that with a high degree of certainty prevent the delta sigma modulator 100 from going into quantizer overload. However, conservatively limiting the range of input signal x(n) also artificially limits the dynamic range of input signal x(n). A second solution for preventing quantizer overload is to clip the quantizer input signal $u_f(n)$ and, thus, limit the quantizer input signal $u_f(n)$ to values within the non-overload operating range of quantizer 108. However, conventional techniques that limit the quantizer input signal $u_f(n)$ suffer from poor signal-to-noise ratios at least during clipping operations.

U.S. Pat. No. 5,243,345 (referred to herein as the "Naus Patent") describes an embodiment of the second quantizer overload prevention solution. The Naus Patent describes a delta sigma modulator that includes a feed-forward type loop filter and signal limiters to regressively limit the quantizer input signal $u_f(n)$ while providing less restrictions on the amplitude range for the input signal x(n). The Naus Patent is entitled "Sigma-Delta Modulator Having a Plural Order Loop Filter with Successive Filter stages of Successively Smaller Signal Excursion Range", inventors Naus et al., filed Feb. 21, 1992, and assigned to U.S. Philips Corp.

FIG. 2 depicts one embodiment of the delta sigma modulator 200 described by the Naus Patent. The delta sigma modulator 200 includes an N-order, low pass loop filter 202 having series connected filter stages 204.0, 204.1, . . . , 204.N−1. Each filter stage 204.x includes an integrator 206.x and a limiter 208.x to limit the output signal amplitude of each filter stage 204.x, where x∈{0, 1, . . . , N−1}. The output signals of all filter stages 204.0, 204.1, . . . , 204.N−1 are adjusted by respective coefficients c.0, c.1, . . . , c.N−1 (also referred to as "weight factors") and added together by an adder stage 208 to generate a filter output/quantizer input signal $u_f(n)$. The loop filter 202 functions in accordance with the transfer function:

$$u_f(n)/u_d(n) = G_0 G_1 \ldots G_{N-1} c_{N-1} + \ldots + G_0 G_1 c_1 + G_0 c_0,$$

where $G_0 G_1, \ldots G_{N-1}$ represent the gains of respective filter stages 204.0, 204.1, . . . , 204.N−1. The limiters 210.0, 210.1, . . . , 210.N−1 regressively limit the filter stage output signals to respective limit values $L_0, L_1, \ldots, L_{N-1}$.

The limiters prevent instabilities in the delta sigma modulator 200 in the event of an increasing input signal 210.0, 210.1, . . . , 210.N−1 by limiting the filter output signal $u_f(n)$ with the last limiter 210.N−1 and systematically regressively limiting the output of immediately preceding filter stages.

The systematic, regressive limitation of preceding filter stages is accomplished by setting limiting values $L_x$ in accordance with:

$$\frac{L_x}{G_0 G_1 \ldots G_x} < \frac{L_{x-1}}{G_0 G_1 \ldots G_{x-1}},$$

where $$x \in (0, 1, \ldots, N-1).$$

However, the noise performance of the Naus Patent delta sigma modulator suffers during overload conditions because the signal transfer function (STF) of the feed-forward loop filter peaks in the near out of band frequencies, thus, severely compromising low pass performance and accentuating noise during overload.

Researchers continue to seek solutions to prevent quantizer overload, achieve faster quantizer overload recovery times, and maintain acceptable signal-to-noise ratios.

SUMMARY OF THE INVENTION

In one embodiment of the present invention, a method of preventing quantizer overload in a delta sigma modulator includes providing quantizer output feedback to an initial filter stage of a loop filter of the delta sigma modulator and providing quantizer feedback to at least one additional filter stage of the loop filter. The method further includes limiting an output of the initial filter stage of the loop filter during quantizer overload prevention conditions and providing an output signal of the initial filter stage to a second filter stage of the loop filter.

In another embodiment of the present invention, a signal processing system includes a delta-sigma modulator having a feedback topology to convert an input signal into an output signal. The delta-sigma modulator includes a delta sigma modulator input to receive the input signal and a quantizer to quantize a quantizer input signal and provide a quantizer output signal via a quantizer output. The delta-sigma modulator further includes a loop filter to provide the quantizer input signal to the quantizer. The loop filter includes an initial filter stage having a limiter $L_0$ to limit an output signal of the initial filter stage. The initial filter stage is coupled to the delta sigma modulator input and the quantizer output. The loop filter also includes a filter section coupled to an output of the initial filter stage and the quantizer output. A transfer function of the loop filter maintains a low pass transfer function when limiter $L_0$ is active.

In a further embodiment of the present invention, a signal processing system includes a delta-sigma modulator to convert an input signal into an output signal. The delta-sigma modulator includes a quantizer to generate a quantizer output signal and a loop filter coupled to the quantizer. The loop filter has a feedback topology. The loop filter includes an initial N successive filter stages (FS) arranged in ascending order $FS_0$ through $FS_{N-1}$, wherein:

- filter stage $FS_0$ receives a difference signal comprised of a difference between the input signal and the quantizer output signal;
- each of the initial N successive filter stages $FS_0$ through $FS_{N-1}$ receives input signals comprised of a feedback signal from the quantizer and an input signal from a preceding filter stage;
- each of the filter stages includes an integrator;
- filter stage $FS_0$ includes limiter $L_0$ to limit output values of filter stage $FS_0$ to a maximum absolute value;
- N is a non-negative integers and $N \geq 2$.

In another embodiment of the present invention, a method of preventing quantizer overload in a delta sigma modulator includes integrating a first difference signal to produce a first integrated output signal. The difference signal includes a difference between a delta sigma modulator input signal and a first quantizer feedback signal. The method further includes limiting the first integrated output signal during quantizer overload prevention conditions to produce a first limited output signal. The method also includes integrating a second difference signal to produce a second integrated output signal. During quantizer overload prevention conditions, the second difference signal includes a difference between a second quantizer output signal and the first limited output signal, and otherwise the second difference signal includes difference between the second quantizer output signal and the first integrated output signal. The method also includes limiting the second integrated output signal if limiting the first integrated output signal is insufficient to prevent quantizer overload.

In another embodiment of the present invention, an apparatus for preventing quantizer overload in a delta sigma modulator includes means for providing quantizer output feedback to an initial filter stage of a loop filter of the delta sigma modulator. The apparatus further includes means for providing quantizer feedback to at least one additional filter stage of the loop filter and means for limiting an output of the initial filter stage of the loop filter during quantizer overload prevention conditions. The apparatus also includes means for providing an output signal of the initial filter stage to a second filter stage of the loop filter.

In a further embodiment of the present invention, an apparatus for preventing quantizer overload in a delta sigma modulator includes means for integrating a first difference signal to produce a first integrated output signal, wherein the difference signal comprises a difference between a delta sigma modulator input signal and a first quantizer feedback signal. The apparatus also includes means for limiting the first integrated output signal during quantizer overload prevention conditions to produce a first limited output signal. The apparatus further includes means for integrating a second difference signal to produce a second integrated output signal, wherein, during quantizer overload prevention conditions, the second difference signal comprises a difference between a second quantizer output signal and the first limited output signal, and otherwise the second difference signal comprises a difference between the second quantizer output signal and the first integrated output signal. The apparatus also includes means for limiting the second integrated output signal if limiting the first integrated output signal is insufficient to prevent quantizer overload.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
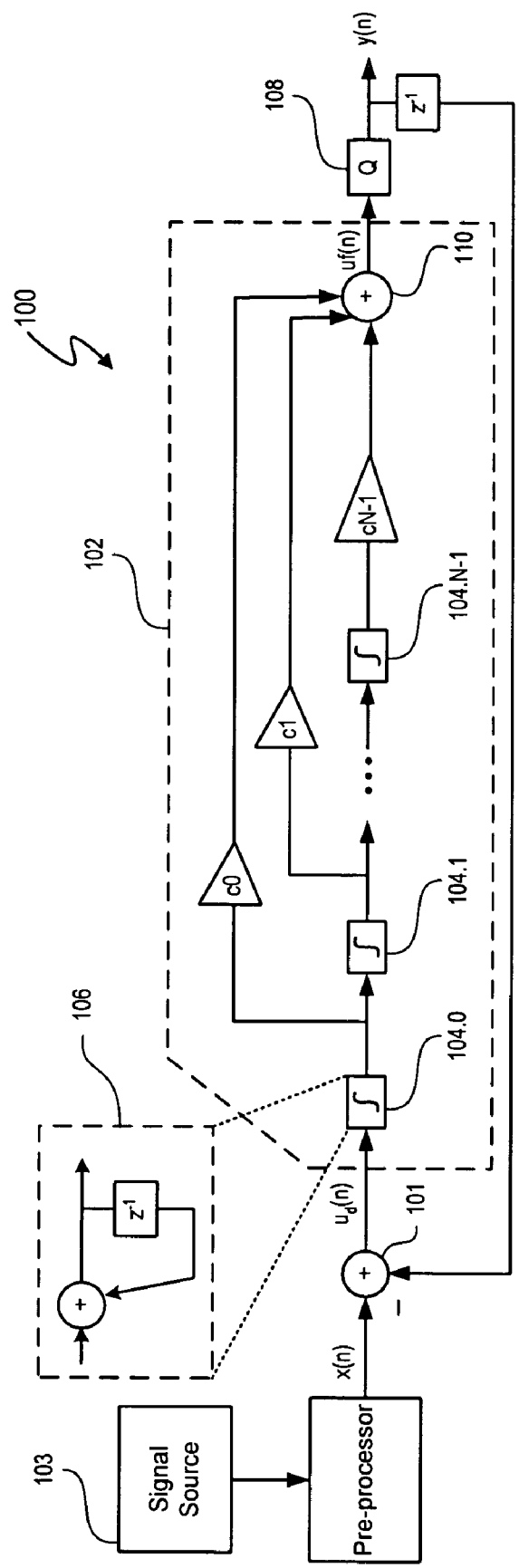
FIG. 1 (labeled prior art) depicts an N-order delta sigma modulator.
Figure 2:
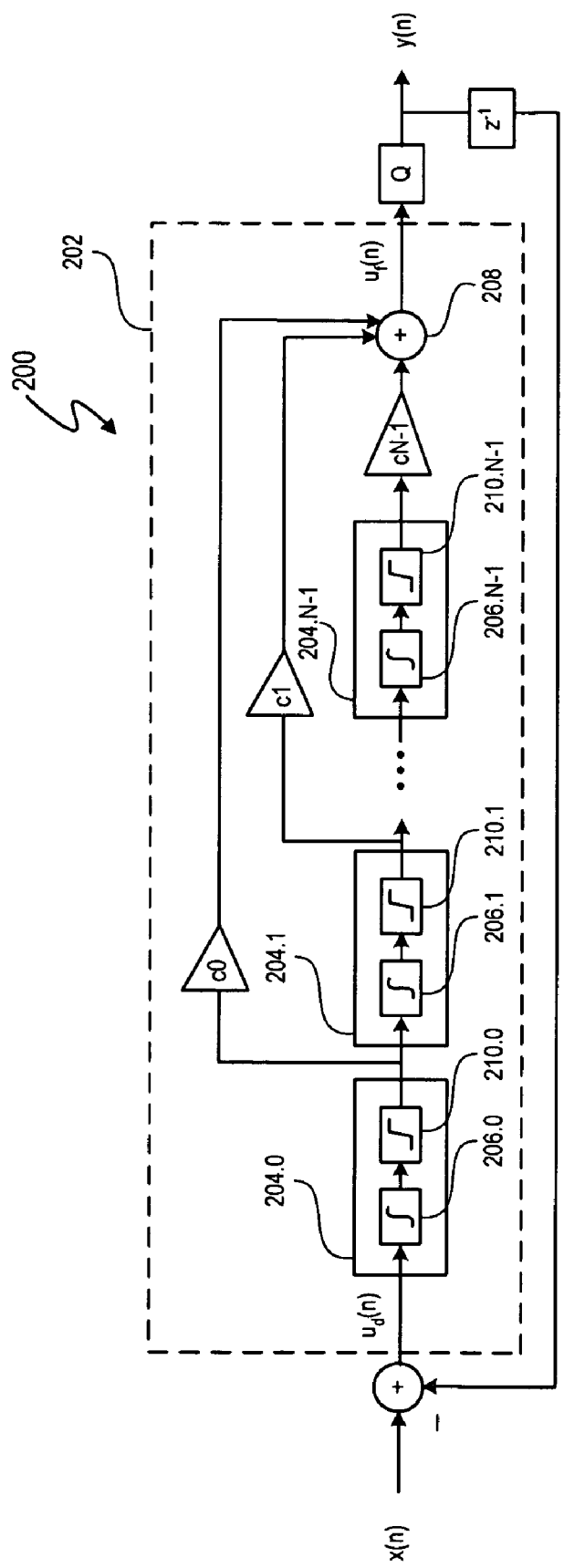
FIG. 2 (labeled prior art) depicts a feed-forward-type N-order delta sigma modulator with systematic, regressive limitation of filter stages beginning with the (N−1) filter stage.

A digital signal processing system includes a delta sigma modulator with a loop filter that maintains a low pass output and a relatively high signal-to-noise ratio during quantizer overload prevention conditions. The low pass output is achieved by maintaining a low pass transfer function of a closed loop in the delta sigma modulator during quantizer overload prevention conditions. The closed loop includes a filter section of the loop filter coupled to a quantizer of the delta sigma modulator. In at least one embodiment, quantizer overload prevention conditions refer to predetermined output signal levels of at least the initial filter stage of the delta sigma modulator loop filter that could cause the quantizer to overload. In at least one embodiment, the delta sigma modulator includes a quantizer overload protected delta sigma modulator with an N-order feedback-type loop filter that initially limits an output of an initial filter stage during quantizer overload prevention conditions. In at least one embodiment, if limiting the output of the initial filter stage is insufficient to prevent quantizer overload, the delta sigma modulator progressively limits an output of at least the next successive filter stage to prevent quantizer overload, where N is a positive integer greater than or equal to two (2). A quantizer of the delta sigma modulator provides feedback to at least the first two filter stages of the loop filter.

The initial filter stage, N=0, of the loop filter receives an input signal derived from an input signal to the delta sigma modulator ("DSM input signal") and a negative feedback signal derived from a quantizer output signal. The N filter stages are successively coupled to each other so that each of the N-1 filter stages after the initial filter stage receives an output signal from the immediately preceding filter stage. The second filter stage, N=1, also receives a negative feedback signal derived from the quantizer output signal. In at least one embodiment, one or more subsequent filter stages, N={2, 3, . . . , and/or N-1}, also receive a negative feedback signal derived from the quantizer output signal. Because the delta sigma modulator utilizes a feedback loop filter topology, the signal transfer function of the delta sigma modulator is low pass. Thus, the signal processed by the loop filter is filtered at a high rate before being clipped, which helps reduce clipping artifacts that would otherwise degrade the SNR of the delta sigma modulator output signal.

For the initial filter stage, N=0, and in one embodiment for one or more filter stages subsequent to the initial filter stage, limiters limit the output of one or more of the subsequent filter stages. The limiter of the initial filter stage is configured to limit the output of the initial filter stage before any subsequent limiter limits the output of any subsequent filter stage. In at least one embodiment, the limiters are configured to progressively limit successive filter stages. In at least one embodiment, the filter stages include a first order integrator, and the limiter for each filter stage resides within a loop of the integrator. Thus, each limiter not only limits the output of a filter stage, the limiter also provides a limit for the state variable(s) of each integrator. In at least one embodiment, a delay is included in a forward path of at least the initial filter stage and preferably in the forward path of each filter stage of the loop filter to improve the SNR of the delta sigma modulator.

In simulation, the feedback-type delta sigma modulator exhibits superior noise reduction, stability, and faster recovery from quantizer overload than conventional technologies such as the feed-forward with limiters technology disclosed in the Naus Patent. As noted previously, the noise performance of the Naus Patent delta sigma modulator suffers during overload prevention conditions because the signal transfer function (STF) of the feed-forward loop filter peaks in the near out of band frequencies, thus, potentially severely compromising low pass performance and accentuating noise during overload. In contrast, embodiments of the feedback-type delta sigma modulator with overload prevention described herein maintain a low pass loop filter transfer function with a sharp cut-off frequency in the near out of band frequencies. Thus, during overload prevention, the feedback-type delta sigma modulator maintains superior noise reduction performance. Additionally, the Naus Patent discloses limiting the output of each filter stage with a limiter connected outside of the integrating network. However, increasing signals to the filter stage continue to cause the state variable(s) of the integrating network to increase. Thus, recovery time from input signals in an overload range increases and SNR can decrease during the extended recovery time.

Figure 3:
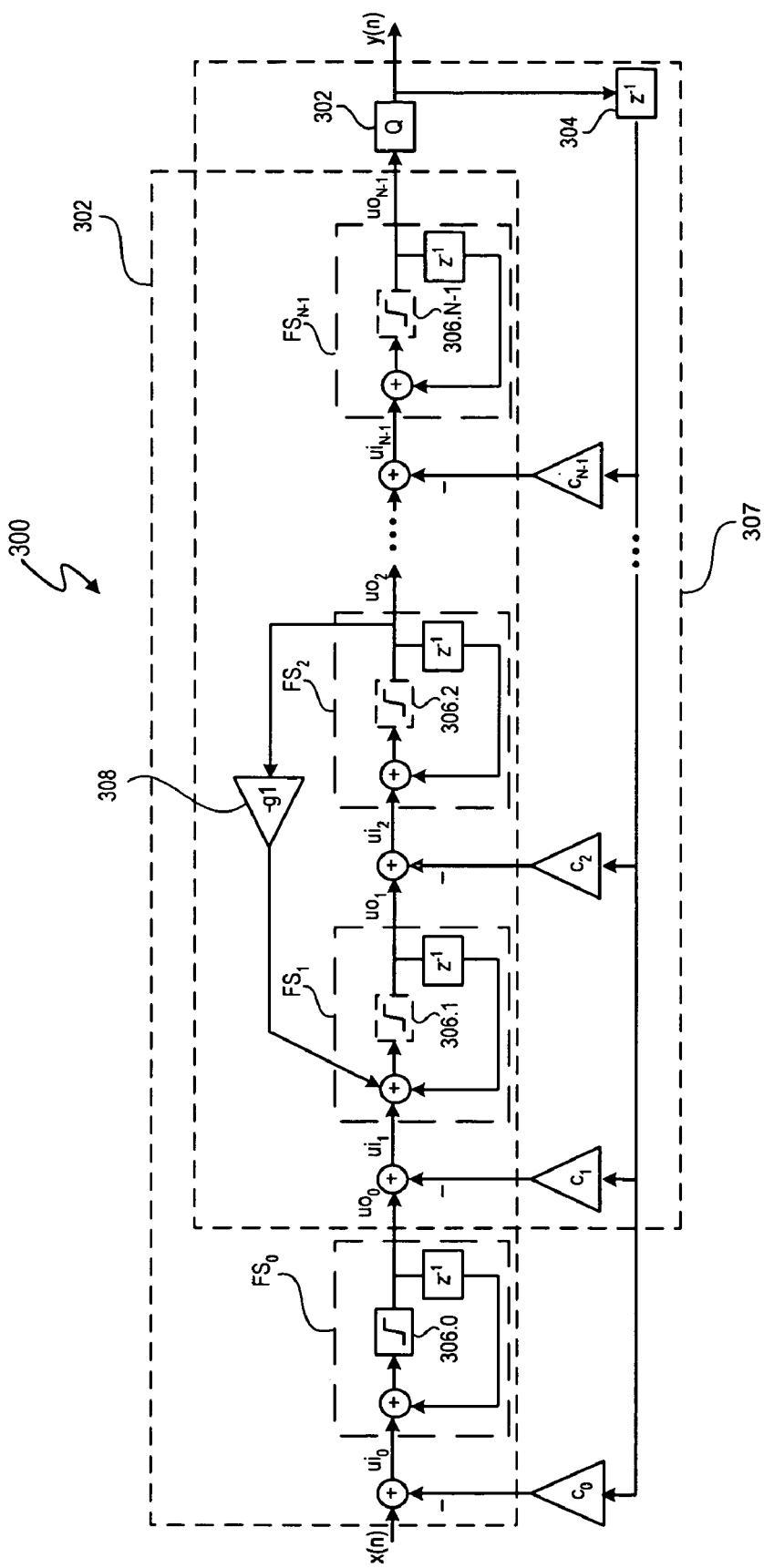
FIG. 3 depicts a quantizer overload protected, feedback-type delta sigma modulator with progressive limitation of filter stages.

FIG. 3 depicts one embodiment of a quantizer overload protected, feedback-type delta sigma modulator. The delta sigma modulator 300 utilizes a feedback-type loop filter 302 with at least two successive filter stages. The delta sigma modulator 300 receives an oversampled input signal x(n), low pass filters input signal x(n), quantizes the filtered signal $u_f(n)$, and generates a quantizer output signal y(n). The loop filter includes N successive filter stages (FS) $FS_0$, $FS_1$, . . . , $FS_{N-1}$, and at least the initial filter stage, $FS_0$, includes limiter 306.0 to limit the respective filter stage output signal $uo_0$ during quantizer overload prevention conditions, where $N \geq 2$. Filter stages $FS_1$ through $FS_{N-1}$ and the quantizer 302 form a closed loop 307 through the feedback path that includes delay 304. When the limiter 306.0 is active during overload prevention conditions, the output signal $uo_0$ of the initial filter stage $FS_0$ can include harmonics outside the baseband frequencies. In at least one embodiment, the closed loop 307 maintains a low pass transfer function and, thus, attenuates the harmonics, when the limiter 306.0 is active during overload prevention conditions. Optionally, one or more successive filter stages $FS_1$, . . . , $FS_{N-1}$ also include limiters 306.1, . . . , 306.N-1 (shown in dashed lines) to limit the respective output signals of filter stages $FS_1$, $FS_2$, . . . , $FS_{N-1}$ during quantizer overload prevention conditions. In at least one embodiment, closed loop 307 maintains a low pass transfer function when any of limiters 306.0, 306.1, . . . , 306.N-1 are active.

During non-overload prevention conditions, each limiter 306.i included in loop filter 302 is inactive, i.e. the limiter 306.i does not limit the input signal $ui_i$. Filter stage $FS_0$ is the initial filter stage, and when a potential quantizer overload prevention condition is detected the limiter $L_0$ of filter stage $FS_0$ is active to limit the output signal $uo_0$ before any subsequent limiter in subsequent filter stages becomes active, i.e. the input signal to the limiter reaches a predetermined level and begins limiting the output signal of the respective filter stage.

The limit levels L (also commonly referred to as "clipping levels") of each filter stage having a limiter are preferably set to prevent quantizer overload. Comparator technology can be used to determine when an input signal $ui_i$ to a limiter has reached the limit $L_i$ of the limiter $306_i$. If the input signal $ui_i$ reaches the limit $L_i$, the limiter $306.i$ is activated and limits (clips) the input signal $ui_i$ to limit $L_i$. In one embodiment, the limit $L_i$ represents a magnitude level that in most cases will prevent quantizer overload. Generally, the initial limiter $306.0$ limits the input signal $ui_0$ to 1 dB to 3 dB above the signal level seen at filter stage $FS_0$ for a normal full scale value of input signal $ui_0$. In one embodiment, the limits $L_i$ for optional limiters 306.1 through 306.N-1 in filter stages after the initial filter stage are set to approximately 6 dB above a normal full-scale design input signal $ui_i$, $i \in \{1, 2, \ldots, N-1\}$.

Simulation has indicated that using a $5^{th}$ order (i.e. N=5) feedback-type delta sigma modulator 300 with progressive filter stage output signal limitation can reduce noise in the delta sigma modulator output signal y(n) by 40 dB in response to a sine wave input signal x(n) that exceeds 3 dB past normal full-scale. Normal full-scale for input signal x(n) is generally set so as to reduce the likelihood of quantizer overload and other signal distortion. An "acceptable likelihood" of quantizer overload and other signal distortion is a matter of design choice.

The quantizer can be designed to generate a single-bit or multi-bit quantizer output signal y(n). The quantizer output signal y(n) is fed back through a delay 304 to each of the N successive filter stages $FS_0$, $FS_1$, ..., $FS_{N-1}$. The delayed quantizer output signal y(n-1) can be weighted by coefficients $c_0$, $c_1$, ..., $c_{N-1}$ to obtain a desired frequency response. Determination of the coefficients $c_0$, $c_1$, ..., $c_{N-1}$ can be accomplished conventionally as, for example, described in Norsworthy et al, "Delta Sigma Data Converters—Theory, Design, and Simulation", 1997, ISBN 0-7803-1045-4, particularly in chapters 3 and 5.

Loop filter 302 is depicted with at least four (4) filter stages, an initial filter stage $FS_0$ and a filter section that includes at least three (3) subsequent filter stages $FS_1$, $FS_2$, and $FS_{N-1}$. In other embodiments, the number N of filter stages is a design choice and is any number greater than or equal to two (2). The loop filter 302 can also include additional filter stages coupled to the N initial filter stages. The additional filter stages are also not required to include limiters. In at least one embodiment, each filter stage $FS_i$ is a first order integrator with a limiter $306_i$ in the integration loop. Inclusion of the limiter $306_i$ in the integration loop limits the output of filter stage $FS_i$ to prevent quantizer overload and limits the state variable of filter stage $FS_i$ to a maximum value to speed recovery from overload prevention conditions.

During operation of delta sigma modulator 300, the initial filter stage $FS_0$ receives an input signal $ui_0(n)$ derived from the delta sigma modulator input signal x(n) and the quantizer feedback signal y(n). In one embodiment, the first stage input signal $ui_0(n)$ is a difference between input signal x(n) and the weighted quantizer output signal $c_0 \times y(n-1)$, i.e. $ui_0 = x(n) - [c_0 \times y(n-1)]$. The input signal $ui_i(n)$ for each subsequent filter stage $FS_i$, $i \in \{1, 2, \ldots, N-1\}$, is derived from the output signal $uo_{i-1}(n)$ of the previous filter stage $FS_{i-1}$ and the quantizer feedback signal y(n). In one embodiment for $i \in \{1, 2, \ldots, N-1\}$, the input signal $ui_i(n) = uo_{i-1}(n) - [c_i \times y(n-1)]$. In the figures, "(n)" is omitted from the filter stage input and output signals to limit congestion.

For $i \in \{1, 2, \ldots, N-1\}$, limiter $306_i$ limits the output signal $uo_i$ of filter stage $FS_i$ to a predetermined level limit $L_i$ if the input signal $ui_i(n) + uo_i(n-1)$ reaches limit $L_i$. Signs of values can be manipulated to change addition operations to subtraction operations and visa versa.

The predetermined limit $L_0$ is established so that limiter 306.0 will limit the output signal $uo_0$ of filter stage $FS_0$ before any subsequent limiters 306.1-306.N-1 limit the respective output signals of filter stages $FS_1$ through $FS_{N-1}$. In one embodiment, the predetermined limit $L_0$ is set so that limiting by limiter 306.0 does not occur until the input signal x(n) is 10-20% above a full-scale value of filter stage when the delta sigma modulator 300 is excited by input signal $ui_0(n)$. In at least one embodiment, the full-scale value of filter stage input signal $ui_0(n)$ is defined by the modulation index of delta sigma modulator 300 times the quantizer feedback signal y(n). Preferably limiters 306.0 through 306.N-1 progressively limit respective filter stages $FS_0$ through $FS_{N-1}$ to maximize noise reduction and minimize recovery time.

Conventional filter design techniques can be utilized in conjunction with the progressive filter stage output signal limitation. For example, loop filter 302 can also include an optional resonator 308 with a gain coefficient of −g1. Resonators are commonly used in delta sigma modulator loop filters to provide more effective noise shaping.

Figure 4:
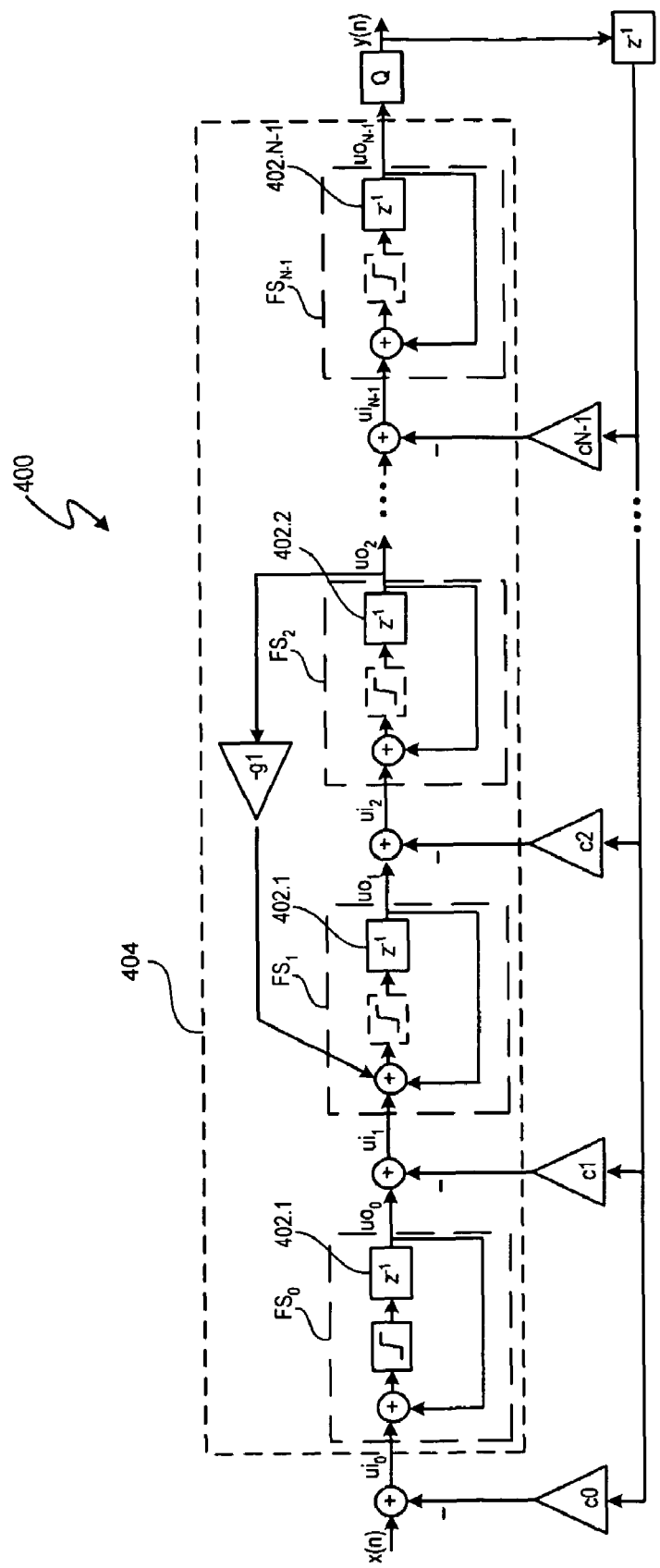
FIG. 4 depicts a quantizer overload protected, feedback-type delta sigma modulator with progressive limitation of filter stages and forward path delays in one or more filter stages.

FIG. 4 depicts another embodiment of a quantizer overload protected, feedback-type delta sigma modulator. The delta sigma modulator 400 is identical to delta sigma modulator 300 except that delays 402.0, 402.1, ..., 402.N-1 are included in the respective forward paths of the filter stages $FS_0$, $FS_1$, ..., $FS_{N-1}$ rather than in the feedback loop of the filter stage integrators. The delays 402.0, 402.1, ..., 402.N-1 improve the low pass filter characteristics of the loop filter 400 of delta sigma modulator 400 during quantizer overload prevention conditions. In one embodiment, the transfer function of each filter stage $FS_0$, $FS_1$, ..., $FS_{N-1}$ with forward path delays is $(z^{-1})/(1-z^{-1})$. Therefore, during quantizer overload prevention conditions, one or more of filter stages $FS_0$, $FS_1$, ..., $FS_{N-1}$ limits the respective filter stage output signal, and delta sigma modulator 400 continues to modulate the delta sigma modulator input signal x(n) with a low pass filter transfer function.

Figure 5:
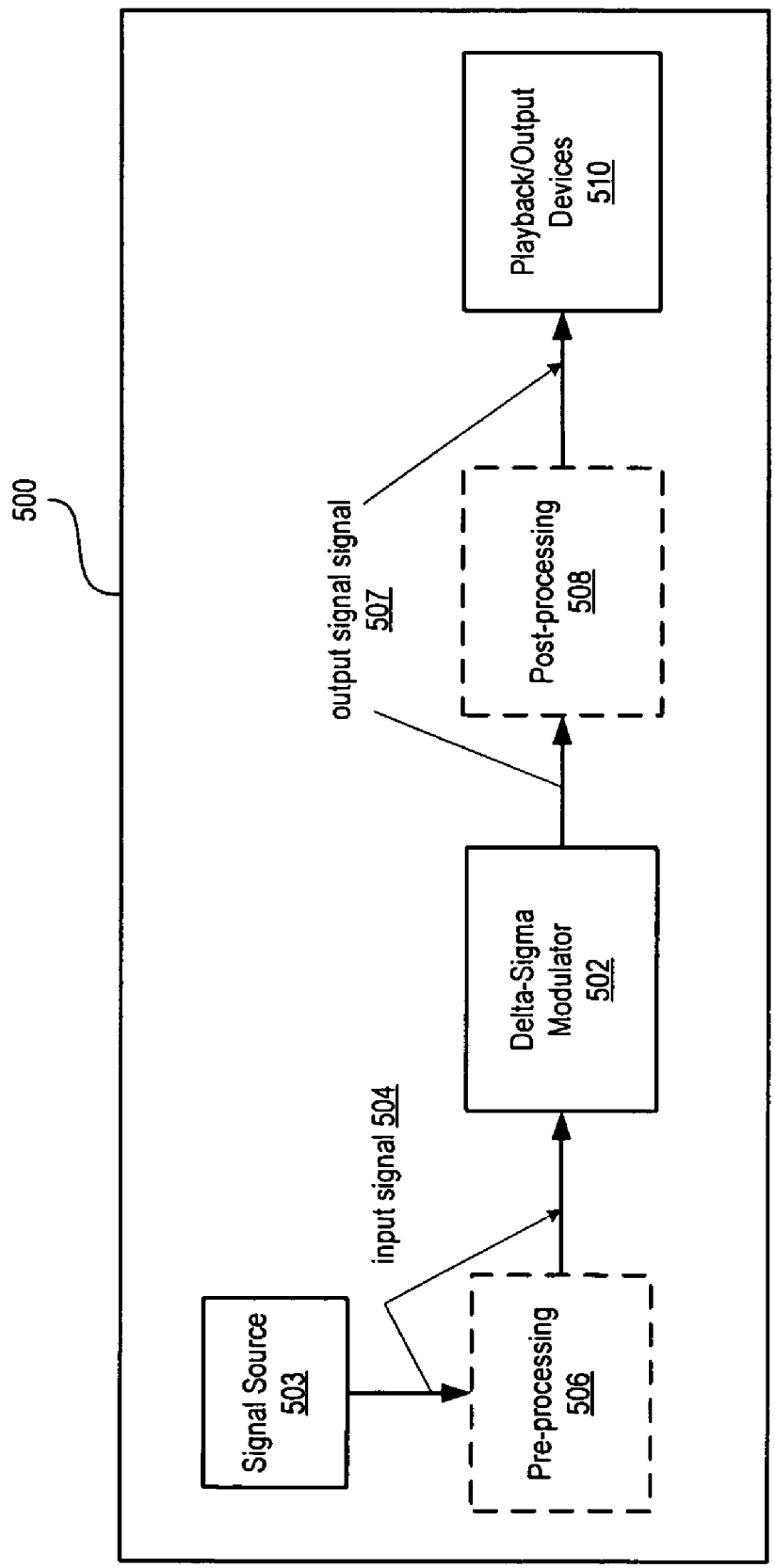
FIG. 5 depicts an exemplary signal processing system that includes a quantizer overload protected, feedback-type delta sigma modulator.

Referring to FIG. 5, signal processing system 500 depicts one embodiment of a signal processing system that includes a delta sigma modulator 502 that maintains a low pass loop filter transfer function during quantizer overload prevention conditions. The delta sigma modulator 502 represents delta sigma modulators such as delta sigma modulator 300 and delta sigma modulator 400, which both include a loop filter for progressively limiting filter stage output signals to provide quantizer overload prevention. Signal processing system 500 is particularly useful for use in a digital-to-analog ("DAC") implementation to drive output devices such as audio speakers. Signal processing system 500 processes an input signal 504 generated by an input signal source 503. The input signal 504 may be digital or analog and may be from any signal source including signals generated as part of a recording/mixing process or other high end audio sources or from lower-end sources such as a compact disk player, MP3 player, audio/video system, audio tape player, or other signal recording and/or playback device.

The input signal 504 may be an audio signal, a video signal, an audio plus video signal, and/or other signal type. Generally, input signal 504 undergoes some preprocessing 506 prior to being modulated by delta sigma modulator 502. For example, pre-processing 506 can involve an interpolation filter to oversample a digital input signal 504 in a well-known manner. Pre-processing 506 can include an analog-to-digital converter to convert an analog input signal 504 into a digital signal. Pre-processing 506 can also include mixing, reverberation, equalization, editing, out-of-band noise filtering and other filtering operations.

In the digital domain, pre-processing 506 provides discrete input signals x[n] to look-ahead delta sigma modulator 502. Each discrete input signal x[n] is an N-bit signal, where N is greater than one. As previously described in more detail, look-ahead delta sigma modulator 502 processes M input signals x[n] and patterns of M output candidates y[n] to determine an output signal 507 from the output candidates corresponding to each input signal x[n]. Output signal 507 is, for example, a collection of one-bit output values. The output signal 507, thus, becomes an encoded version of the input signal 504.

Signal processing system 500 typically includes post-processing 508 to post-process the output signal 507 of delta sigma modulator 502. Post-processing 508 can include an analog filter to convert the output signal 507 into an analog drive signal for playback/output devices 510. In at least one embodiment, the playback/output devices 510 represent audio speakers.

The signal processing systems disclosed herein can be manufactured using well-known integrated, discrete, or a combination of integrated and discrete components. Additionally, software in combination with a processor can be used to implement features of the signal processing systems. In particular, the delta sigma modulators described herein can be implemented using hardware, software, or a combination of hardware and software.

Although the present invention has been described in detail, it should be understood that various changes, substitutions and alterations can be made hereto without departing from the spirit and scope of the invention as defined by the appended claims.

What is claimed is:

1. A method of preventing quantizer overload in a delta sigma modulator, wherein a closed loop of the delta sigma modulator includes one or more filter stages of the loop filter coupled to the output of the initial filter stage, a quantizer coupled to an output of the loop filter, and a feedback path coupled between an output of the quantizer and one or more of the filter stages coupled to the output of the initial filter stage, the method comprising:
providing a delta sigma modulator input signal minus a quantizer output feedback signal to an initial filter stage of a loop filter of the delta sigma modulator;
providing quantizer feedback to at least one additional filter stage of the loop filter;
limiting an output of the initial filter stage using a limiter in an integrator of the initial filter stage of the loop filter;
providing an output signal of the initial filter stage to a second filter stage of the loop filter; and
maintaining a low pass transfer function of the closed loop when limiting the output of the initial filter stage of the loop filter.

2. The method of claim 1 further comprising:
progressively limiting one or more successive filter stages coupled to the initial filter stage of the loop filter using limiters in each of the one or more successive filter stages if limiting the output of an immediately preceding filter stage is insufficient to prevent quantizer overload.

3. The method of claim 2 further comprising:
providing an output signal from each filter stage, except a last filter stage in the loop filter, to an immediately successive stage; and
delaying a forward path signal in each filter stage.

4. The method of claim 2 wherein a closed loop of the delta sigma modulator includes one or more filter stages of the loop filter coupled to the output of the initial filter stage, a quantizer coupled to an output of the loop filter, and a feedback path coupled between an output of the quantizer and one or more of the filter stages coupled to the output of the initial filter stage, the method further comprising:
maintaining a low pass transfer function of the closed loop when limiting the output of any of the filter stages.

5. The method of claim 1 further comprising:
delaying a forward path signal of the initial filter stage.

6. The method of claim 5 wherein a z-domain transfer function of the initial filter stage comprises $(z^{-1})/(1-z^{-1})$.

7. The method of claim 1 wherein the quantizer output feedback is individually weighted for each filter stage.

8. The method of claim 1 wherein the limiter is a clipper and limiting an output of the initial filter stage comprises clipping an output of the initial filter stage using the limiter during quantizer overload prevention conditions.

9. A signal processing system comprising:
a delta-sigma modulator having a feedback topology to convert an input signal into an output signal, the delta-sigma modulator comprising:
a delta sigma modulator input to receive the input signal;
a quantizer to quantize a quantizer input signal and provide a quantizer output signal via a quantizer output; and
a loop filter to provide the quantizer input signal to the quantizer, the loop filter comprising:
an initial filter stage having a limiter $L_0$ in an integrator of the initial filter stage to limit an output signal of the initial filter stage, wherein the initial filter stage is coupled to the delta sigma modulator input and the quantizer output; and
a filter section coupled to an output of the initial filter stage and the quantizer output;
wherein a transfer function of a closed loop, comprising the filter section coupled to the quantizer, has a low pass transfer function when limiter $L_0$ is active.

10. The signal processing system of claim 9 wherein the filter section includes at least a first filter stage having a limiter $L_1$ to limit an output signal of the first filter stage.

11. The signal processing system of claim 10 wherein the limiter $L_0$ is active to limit the output signal of the initial filter stage before any limiter of any subsequent filter stage of the loop filter limits an output signal of any of the subsequent filter stages.

12. The signal processing system of claim 11 wherein the limiter $L_0$ limits the output signal of the initial filter stage to approximately 1 dB to 3 dB above a normal full-scale value of the input signal to the initial filter stage.

13. The signal processing system of claim 10 wherein the transfer function of the closed loop maintains a low pass transfer function when limiters $L_0$ and $L_1$ are active.

14. The signal processing system of claim 10 wherein the first filter stage of the filter section includes an integrator having a feedback loop coupled to an output of the limiter $L_1$.

15. The signal processing system of claim 10 wherein the limiter $L_0$ limits an output signal of the first filter stage of the filter section to approximately 6 dB above a normal full-scale value of an input signal to the first filter stage.

16. The signal processing system of claim 9 wherein the integrator of the initial filter stage includes a feedback loop connected to an output of the limiter $L_0$.

17. The signal processing system of claim 9 wherein the loop filter further comprises:
a first delay component in a forward path of the initial filter stage.

18. The signal processing system of claim 17 wherein a z-domain transfer function of the initial filter stage comprises $(z^{-1})/(1-z^{-1})$.

19. The signal processing system of claim 17 wherein the loop filter further comprises:
delay components in forward paths of each filter stage of the filter section.

20. The signal processing system of claim 9 comprises an audio signal processing system.

21. The signal processing system of claim 9 wherein the limiter $L_0$ is a clipper, and the clipper is configured to clip an output signal of the initial filter stage during quantizer overload prevention conditions.

22. A signal processing system comprising:
a delta-sigma modulator to convert an input signal into an output signal, the delta-sigma modulator comprising:
a quantizer to generate a quantizer output signal; and
a loop filter coupled to the quantizer, the loop filter having a feedback topology and comprising:
an initial N successive filter stages (FS) arranged in ascending order $FS_0$ through $FS_{N-1}$, wherein:
filter stage $FS_0$ receives a difference signal comprised of a difference between the input signal and the quantizer output signal;
each of the initial N−1 successive filter stages $FS_1$ through $FS_{N-1}$ receives input signals comprised of a feedback signal from the quantizer and an input signal from a preceding filter stage;
each of the filter stages includes an integrator;
the integrator of filter stage $FS_0$ includes limiter $L_0$ to limit output values of filter stage $FS_0$ to a maximum absolute value;
N is a non-negative integers and N≧2;
a transfer function of a closed loop, comprising the filter stages $FS_1$ through $FS_{N-1}$ coupled to the quantizer maintains a low pass transfer function when limiter $L_0$ is active limiting respective output values of filter stage $FS_0$.

23. The signal processing system of claim 22 wherein at least one of filter stages $FS_1$ through $FS_{N-1}$ includes a limiter to limit respective output values of filter stages $FS_1$ through $FS_{N-1}$ having a limiter to a respective maximum absolute value and the limiter of stage $FS_0$ is adapted to limit an output value of the integrator of stage $FS_0$ before any limiter of any subsequent stage of the loop filter limits an output value of any of the subsequent stages.

24. The signal processing system of claim 22 wherein each filter stage $FS_i$ further includes a delay component in a forward path of the filter stage $FS_i$, wherein i is a non-negative integer and i is an element of the set {0, 1, ..., N−1}.

25. The signal processing system of claim 24 wherein a z-domain transfer function of each filter stage $FS_i$ comprises $(z^{-1})/(1-z^{-1})$.

26. The signal processing system of claim 22 wherein the limiter $L_0$ is a clipper, and the clipper is configured to clip output values of filter stage $FS_0$ to a maximum absolute value during quantizer overload prevention conditions.

27. A method of preventing quantizer overload in a delta sigma modulator, the method comprising:
receiving a first difference signal in an initial filter stage of a loop filter of the delta sigma modulator, wherein the difference signal comprises a difference between a delta sigma modulator input signal and a first quantizer feedback signal;
limiting the first difference signal with a limiter disposed within an integrator of the initial filter;
integrating the first limited difference signal to produce a first limited integrated output signal;
integrating a second difference signal to produce a second integrated output signal, wherein the second difference signal comprises a difference between a second quantizer output signal and the first limited integrated output signal;
limiting the second integrated output signal if limiting the first difference signal is insufficient to prevent quantizer overload; and
maintaining a low pass transfer function in the delta sigma modulator when limiting the first integrated output signal.

28. The method of claim 27 wherein a z-domain of a transfer function of the initial filter stage comprises $(z^{-1})/(1-z^{-1})$.

29. The method of claim 27 wherein limiting the first difference signal during quantizer overload prevention conditions to produce the first limited difference signal generates harmonics in the first limited integrated output signal, the method further comprising:
attenuating the harmonics of the first limited integrated output signal when limiting the first difference signal; and
generating an output signal of a quantizer of the delta sigma modulator in which the harmonics of the first limited integrated output signal are attenuated.

30. The method of claim 27 wherein the limiter is a clipper and limiting the first difference signal with a limiter disposed within an integrator of the initial filter stage comprises clipping the first difference signal with a clipper during quantizer overload prevention conditions.

31. An apparatus for preventing quantizer overload in a delta sigma modulator, wherein a closed loop of the delta sigma modulator includes one or more filter stages of the loop filter coupled to the output of the initial filter stage, a quantizer coupled to an output of the loop filter, and a feedback path coupled between an output of the quantizer and one or more of the filter stages coupled to the output of the initial filter stage, the apparatus comprising:
means for providing a delta sigma modulator input signal minus a quantizer output feedback signal to an initial filter stage of a loop filter of the delta sigma modulator;
means for providing quantizer feedback to at least one additional filter stage of the loop filter;
means for limiting an output of the initial filter stage using a limiter in an integrator of the initial filter stage of the loop filter; and
means for providing an output signal of the initial filter stage to a second filter stage of the loop filter;
wherein a low pass transfer function of the closed loop is maintained when limiting the output of the initial filter stage of the loop filter.

32. An apparatus for preventing quantizer overload in a delta sigma modulator, the apparatus comprising:
means for receiving a first difference signal in an initial filter stage of a loop filter of the delta sigma modulator, wherein the difference signal comprises a difference between a delta sigma modulator input signal and a first quantizer feedback signal;
means for limiting the first difference signal with a limiter disposed within an integrator of the initial filter stage to produce a first limited difference signal while maintaining a low pass transfer function in the delta sigma modulator when limiting the first integrated output signal;

means for integrating the first limited difference signal to produce a first limited integrated output signal;

means for integrating a second difference signal to produce a second integrated output signal, wherein the second difference signal comprises a difference between a second quantizer output signal and the first limited integrated output signal; and means for limiting the second integrated output signal if limiting the first difference signal is insufficient to prevent quantizer overload.

* * * * *